(12) United States Patent
Gebhard et al.

(10) Patent No.: US 9,935,722 B2
(45) Date of Patent: Apr. 3, 2018

(54) HARMONIC SUPPRESSING LOCAL OSCILLATOR SIGNAL GENERATION

(71) Applicant: Intel IP Corporation, Santa Clara, CA (US)

(72) Inventors: Andreas Gebhard, Linz (AT); Silvester Sadjina, Linz (AT); Krzysztof Dufrene, Plesching (AT); Stefan Tertinek, Linz (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/188,267

(22) Filed: Jun. 21, 2016

(65) Prior Publication Data

US 2017/0366280 A1 Dec. 21, 2017

(51) Int. Cl.
*H04L 27/20* (2006.01)
*H04B 15/06* (2006.01)
*H03D 7/14* (2006.01)

(52) U.S. Cl.
CPC ........... *H04B 15/06* (2013.01); *H03D 7/1441* (2013.01)

(58) Field of Classification Search
CPC .............................. H04B 15/06; H03D 7/1441
See application file for complete search history.

(56) References Cited

U.S. PATENT DOCUMENTS

| | | | | |
|---|---|---|---|---|
| 2008/0014896 A1* | 1/2008 | Zhuo | ...................... | H03D 7/166 455/326 |
| 2008/0056337 A1* | 3/2008 | Tal | .......................... | H03B 21/02 375/219 |
| 2014/0370833 A1* | 12/2014 | Din | ...................... | H04B 1/1027 455/326 |
| 2015/0126145 A1* | 5/2015 | Casagrande | ........... | H04B 15/06 455/226.1 |
| 2017/0025999 A1* | 1/2017 | Bao | .......................... | H03D 7/12 |

OTHER PUBLICATIONS

Weldon, Jeffrey et al. "A 1.75-GHz Highly Integrated narrow-Band CMOS Transmitter with Harmonic-Rejection Mixers," IEEE Journal of Solid-State Circuits, vol. 336, No. 12, Dec. 2001, pp. 2003-2015.

Zhang, Huajiang et al. "A Harmonic-Rejection Mixer with Improved Design Algorithm for Broadband TV Tuners," RM03B-2, 2012 IEEE Radio Frequency Integrated Circuits Symposium, pp. 163-166.

Notice of Allowance in connection with U.S. Appl. No. 15/251,142.

* cited by examiner

*Primary Examiner* — Syed Haider

(74) *Attorney, Agent, or Firm* — Eschweiler & Potashnik, LLC

(57) ABSTRACT

A transceiver includes local oscillator (LO) signal circuitry configured to output an LO signal having an LO frequency and mixer circuitry configured to input the LO signal and an information signal that encodes communication data and output a shifted signal that corresponds to the information signal shifted to a desired frequency. The LO signal circuitry includes selection circuitry and generation circuitry. The selection circuitry is configured to select a pulse pattern and a gap duration based at least on a target harmonic of the LO frequency to be suppressed. The pulse pattern includes at least two pulses spaced apart by a gap having the gap duration. The generation circuitry is configured to generate an LO signal characterized by the selected pulse pattern and gap duration.

23 Claims, 6 Drawing Sheets

HARMONIC SUPPRESSING LOCAL OSCILLATOR SIGNAL GENERATION

FIELD

The present disclosure relates to the field of radio frequency (RF) transceivers and in particular to methods and apparatus for suppressing undesired harmonics generated by mixer circuits in an RF front end.

BACKGROUND

Carrier aggregation (CA) is becoming more common in wireless communication. User equipment (UE) devices that support CA operation include multiple receivers and/or multiple transmitters. In carrier aggregation, data is either received or transmitted simultaneously in more than one frequency interval. While carrier aggregation greatly increases the rate with which data can be wirelessly communicated, CA operation means that multiple received signals having different frequencies are being down-converted by a device at the same time transmitted signals are being up-converted at different frequencies, leading to possible interference between the signals.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Mixers are used in transceiver front ends to increase the frequency of a baseband signal to RF for transmission by an antenna and also to decrease the frequency of a received RF signal to a baseband frequency. For the purposes of this discussion, a receiver mixer will be described, however, the techniques described herein are equally applicable to transmitter mixers as well. The mixer inputs the signal received from the antenna and a signal from a local oscillator with frequency fLO, and outputs a signal that corresponds to the received signal shifted to the baseband frequency.

In Cartesian transceivers, the mixer produces four signal phase components I+, I−, Q+, and Q− and the local oscillator signal also has four phase components. One common way to implement a mixer in a Cartesian transceiver is to use a local oscillator signal in which the phase components each have a 25% duty cycle and wherein the duty cycle of each phase component does not overlap with respect to the duty cycles of the other phase components. The LO signal for each phase feeds a switch that, when ON, generates the mixer output. Due to the 25% duty cycle, when one signal phase component is being generated, (i.e., the switch is ON), the other three signal phase components are not being generated (i.e., the switches for those phases are OFF) reducing interference between the switches.

Figure 1A:
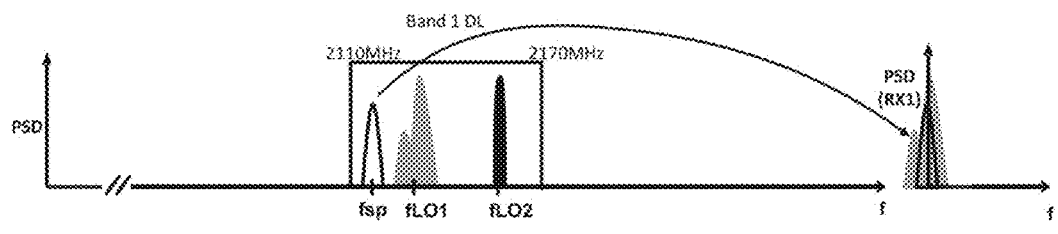
FIGS. 1A-1C illustrate types of harmonic-related interference experienced by a transceiver during frequency division duplex operation of carrier aggregation.
Figure 1B:
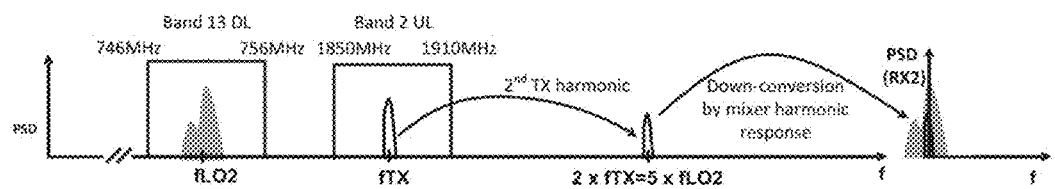
Figure 1C:
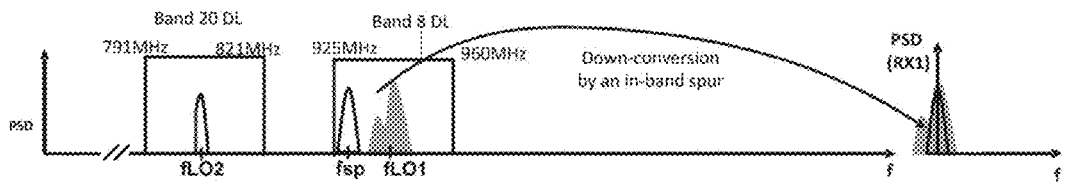

When switches, such as CMOS transistors, are used to implement a mixer circuit harmonics of the fLO (e.g., 2fLO, 3fLO, and so on) are also generated. When, as in carrier aggregation or frequency division duplex systems, multiple receivers and/or transmitters are in operation simultaneously a harmonic of one of the subsystems (e.g., either receiver or transmitter) may be close to a frequency generated by another subsystem, resulting in interference. The harmonic response of a 25% duty cycle mixer contains even and odd harmonics of the local oscillator frequency. This may lead to down-conversion of unwanted signal contents. Further, one or more of the receiver mixer harmonics may down-convert an unwanted signal into the receiver's baseband signal. Harmonics of the different subsystems can couple with each other and produce new spur frequency content which may fall near the transmit frequency or transmit frequency harmonics or near an in-band blocker interference. Thus the newly generated spur frequency can down-convert interference into the baseband and disturb the desired receive signal. FIGS. 1A-1C illustrate just a few specific examples of interference that may occur during carrier aggregation. Many other types of interference are possible due to the number of different frequencies in use during CA operation.

FIG. 1A illustrates the power spectral density (PSD) describing in-band interference that may occur during intra-band carrier aggregation. In FIG. 1A, there are two receiver subsystems, one with fLO1 and one with fLO2. The first receiver's frequency, fLO1, is 2137.5 MHz and the second receiver's frequency, fLO2, is 2142.5 MHz, which are both in band 1. A spur will be generated at 3×fLO1−2×fLO2=2127.5 MHz, which also falls within band 1. Other combinations of harmonics of fLO1 and fLO2 could also produce a spur that falls within band 1. This spur may down-convert the received signals to create interference in the baseband signal RX1 produced by the first receiver. If the third harmonic of the first mixer (3×fLO1) could be suppressed, this type of interference could be mitigated.

FIG. 1B illustrates the PSD describing transmitter harmonics being down-converted due to the harmonic response of a receiver. In an inter-band CA scenario, the uplink primary component carriers (PCC) are in band 2 at fTX=1875 MHz. The downlink secondary component carriers (SCC) are in band 13 at fLO2=750 MHz. The $2^{nd}$ order TX harmonic signal will be present around 3750 MHz and at the same time the $5^{th}$ harmonic of the fLO2 occurs at 3750 MHz. The $5^{th}$ harmonic signal down-converts the unwanted $2^{nd}$ order TX harmonic signal to create interference in the second receiver's baseband signal RX2. If the $5^{th}$ harmonic of fLO2 could be suppressed, this type of interference could be mitigated.

FIG. 1C illustrates the PSD describing the down conversion of an in-band blocking signal. In one inter-band carrier aggregation scenario, the first receiver mixer frequency fLO1 is in band 8 at 942.5 MHz. The second receiver mixer frequency fLO2 is in band 20 at 806 MHz. A spur that is created by the law −5×fLO1+7×fLO2 occurs at fsp=929.5 MHz, which falls in band 8. The spur may down-convert the in-band blocker signal to create interference in the baseband signal RX1 produced by the first receiver. If the $5^{th}$ harmonic of fLO1 or the $7^{th}$ harmonic of fLO2 could be suppressed, this type of interference could be mitigated.

Other types of interference are possible during carrier aggregation. Harmonic crosstalk is produced by harmonics of passive mixers. In some situations, the crosstalk generates spurs due to coupling. Selective suppression of problematic harmonics can mitigate this type of interference.

In transmitter carrier aggregation, the downlink PCC for fLO1 is 852 MHz in band 27 and the uplink SCC fTX2 is 2535 MHz in band 7. The $3^{rd}$ harmonic of fLO1 is 2556 MHz, which may mix down the secondary leaked signal which is in band 7. If the $3^{rd}$ harmonic of fLO1 could be suppressed, this type of interference could be mitigated. Intermodulation distortion induced by inter-band TX carrier aggregation is a problem if the 2×fLOTX1−fLOTX2 or 2×fLOTX2−fLOTX1 falls near a harmonic of a receiver LO signal. Suppressing the harmonic of fLO1 or fLO2 which is near 2×fLOTx1−fLOTx2 or 2×fLOTx2−fLOTx1 could mitigate this type of interference.

The present disclosure concerns methods and apparatus for suppressing harmonics generated by mixers by providing an LO signal that is a pulse series having at least one gap during the duty cycle for each signal component. The arrangement of the series of pulses, the width or duration of the pulses, and the width or duration of the gap(s) are selected based on the harmonics to be suppressed. In this manner, the mixer is driven with a waveform that has no content at one or more selected harmonics to avoid harmonic down-mixing of unwanted signal into a receiver's baseband signal. When a 25% duty cycle is used, the benefits of having non-overlapping ON states of mixer switches are maintained while rejection or suppression of unwanted harmonics is obtained.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be incorporated with each other, unless specifically noted otherwise.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 2:
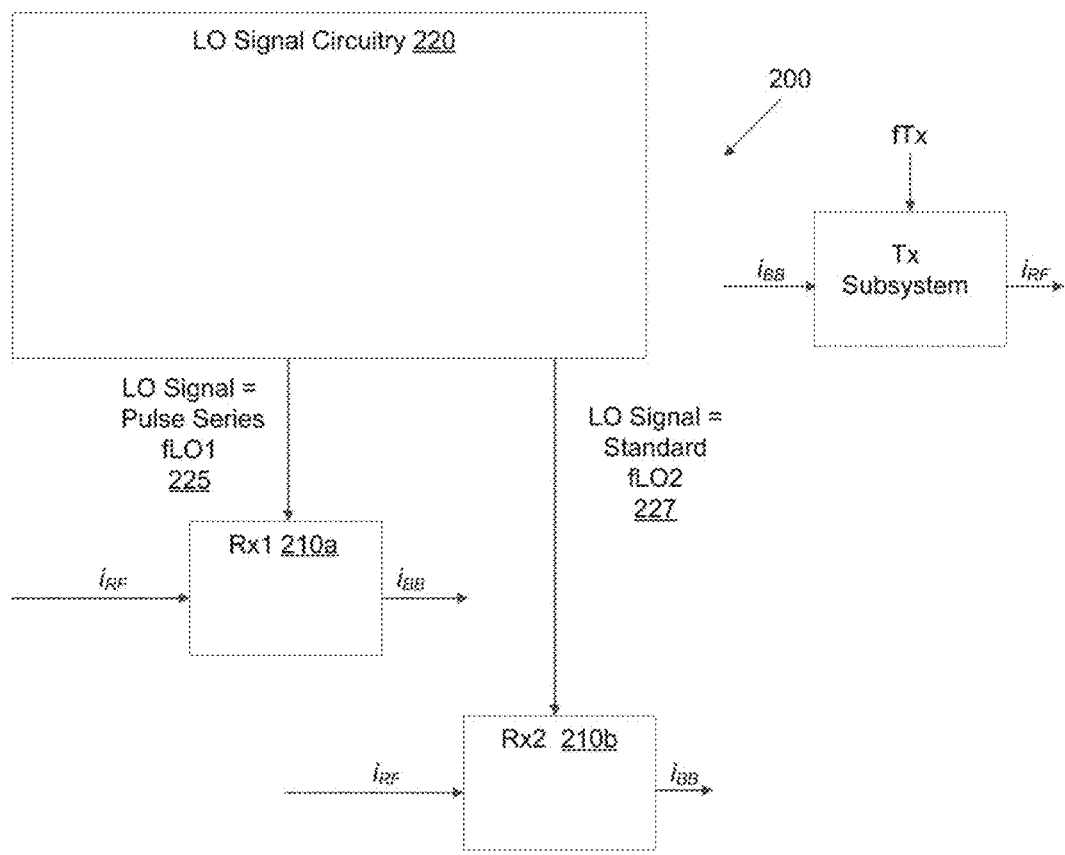
FIG. 2 illustrates an example transceiver architecture in which a harmonic suppressing local oscillator (LO) signal corresponding to a pulse series is generated to suppress harmonics in a mixer, according to one embodiment of the disclosure.

FIG. 2 illustrates a block diagram of one embodiment of a transceiver architecture 200 that includes local oscillator (LO) signal circuitry 220 configured to reduce interference between a transmitter subsystem (Tx), a first receiver subsystem (Rx1) 210a, and/or a second receiver subsystem (Rx2) 210b by selectively generating harmonic suppressing LO signals. Each subsystem includes a mixer that inputs the signal received from the antenna and a signal from a local oscillator with frequency fLO and outputs a signal that corresponds to the received signal shifted to the baseband frequency. Rx1 210a operates a first receive frequency fLO1 and Rx2 210b operates at a second receive frequency fLO2. The Tx subsystem operates at a frequency fTx. Recall that in carrier aggregation operation, the first receiver 210a, the second receiver 210b, and the transmitter mixer may all be converting signals at different frequencies simultaneously, making interference between the mixers likely. The LO signal circuitry 220 mitigates the likelihood of interference by identifying a "target" harmonic of either of the receive frequencies fLO1 and fLO2 that may cause interference. The LO signal circuitry 220 adapts the LO signal provided to the receiver mixer producing the target harmonic such that the LO signal is a pulse series that has no content at the target harmonic. While two receiver subsystems and a single transmitter subsystem are shown in FIG. 2, a transceiver architecture that selectively generates harmonic suppressing LO signals may include more than two receiver subsystems and more than one transmitter subsystem.

The LO signal circuitry 220 includes a digitally controlled oscillator (DCO) (not shown) that is controlled to provide a timing signal having a frequency fLO1, fLO2, or fTx. The LO signal circuitry 320 uses the signal from the DCO to generate the LO signal. In one embodiment, separate LO signal circuitry 220 is provided for each subsystem in a transceiver. In another embodiment, the same LO signal circuitry is used to generate LO signals for more than one subsystem in the transceiver.

By way of example, as shown in FIG. 2, in one embodiment if the LO signal circuitry 220 identifies the third harmonic of fLO1 as likely to cause interference either with the second receiver 210b or the transmitter, the LO signal circuitry 220 generates an LO signal having the frequency fLO1 that is a harmonic suppressing pulse series, which will be described in more detail below, and provides the pulse series to the receiver 210a. At the same time, the LO signal circuitry 220 may provide a standard LO signal (e.g., a 25% duty cycle pulse) having the frequency fLO2 to the second receiver 210b since the second receive frequency fLO1 is not producing the target harmonic. Similarly, if a harmonic of fLO2 were identified as likely to cause interference, the LO signal circuitry 220 would generate an LO signal that is a harmonic suppressing pulse series and provide the pulse series to the second receiver 210b while providing the standard LO signal to the first receiver 210a. For the purposes of this description, the LO signal circuitry 220 is described in the context of generating LO signals for receivers. However, the same techniques and circuitries described herein may be used to generate harmonic suppressing LO signals for transmitters as well.

Figure 3:
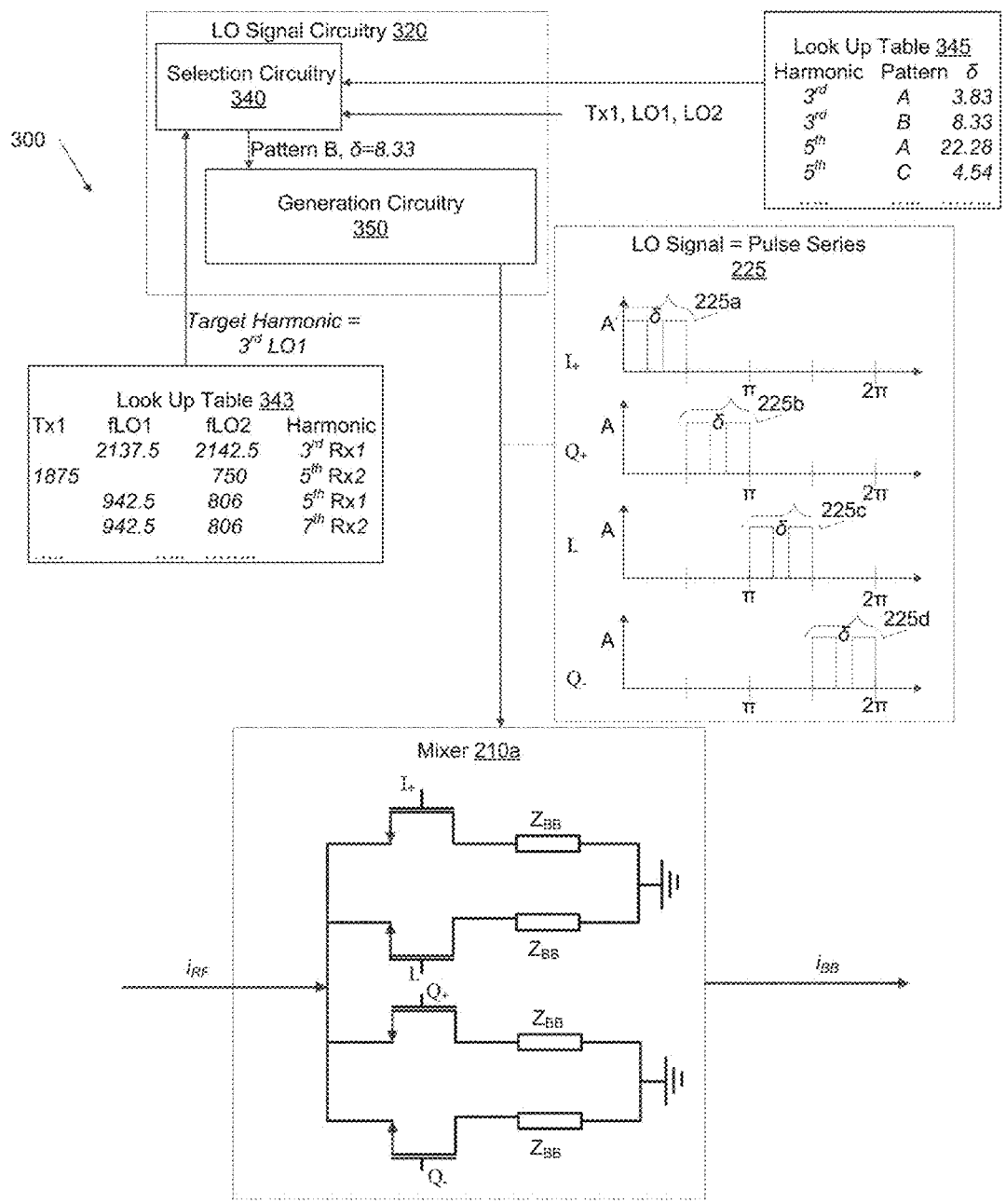
FIG. 3 illustrates an example transceiver architecture in which a harmonic suppressing local oscillator (LO) signal corresponding to a pulse series is generated to suppress harmonics in a mixer, according to one embodiment of the disclosure.

FIG. 3 illustrates one embodiment of a transceiver architecture 300 in which the mixer of the first receiver 210a is embodied as a 25% duty-cycle mixer. For the sake of simplicity, the second receiver and transmitter of FIG. 2 are not shown in FIG. 3. The mixer in receiver 210a includes a switch (e.g., transistor or CMOS) for each phase of the mixer (I+, I−, Q+, Q−). $Z_{BB}$ is the equivalent impedance of an amplifier at the drain port of each switch. To reduce interference, the LO signal provided to the mixer activates a single switch at a time. The standard 25% duty cycle LO signal has a frequency of fLO1 and is series of four non-overlapping pulses, each pulse with a duration of 25% of the period of the LO signal. One of the four pulses is provided to one of the gates, in turn, to convert all four phases of the RF signal $i_{RF}$ (referred to herein as the "information signal") to a baseband signal $i_{BB}$. When the standard 25% duty cycle LO signal is used by the mixer, the output of the mixer includes the even and odd harmonics of fLO1 which may lead to down-conversion of unwanted frequency content.

To mitigate the interference caused by harmonics of fLO1 on the second receiver 210b and/or the transmitter (see FIG. 2), the LO signal circuitry 320 is configured to, when appropriate, provide a harmonic suppressing LO signal 225 that is a series of pulses spaced apart by a gap having a duration of δ rather than the standard 25% duty cycle LO signal. The LO signal circuitry 320 includes selection circuitry 340 and generation circuitry 350. The selection circuitry 340 is configured to select a pulse pattern and the gap duration δ based on a target harmonic of the LO frequency that is to be suppressed. The pulse pattern includes at least two pulses that occur during a single period of the LO signal. The generation circuitry 350 is configured to generate an LO signal characterized by the selected pulse pattern and gap duration, which is provided to the first receiver 210a. In one embodiment, there is separate generation circuitry 350 for each subsystem (e.g., the receiver 210b and the transmitter in FIG. 2), however only the generation circuitry 350 that generates the LO signal for receiver 210a is illustrated.

Figure 4:
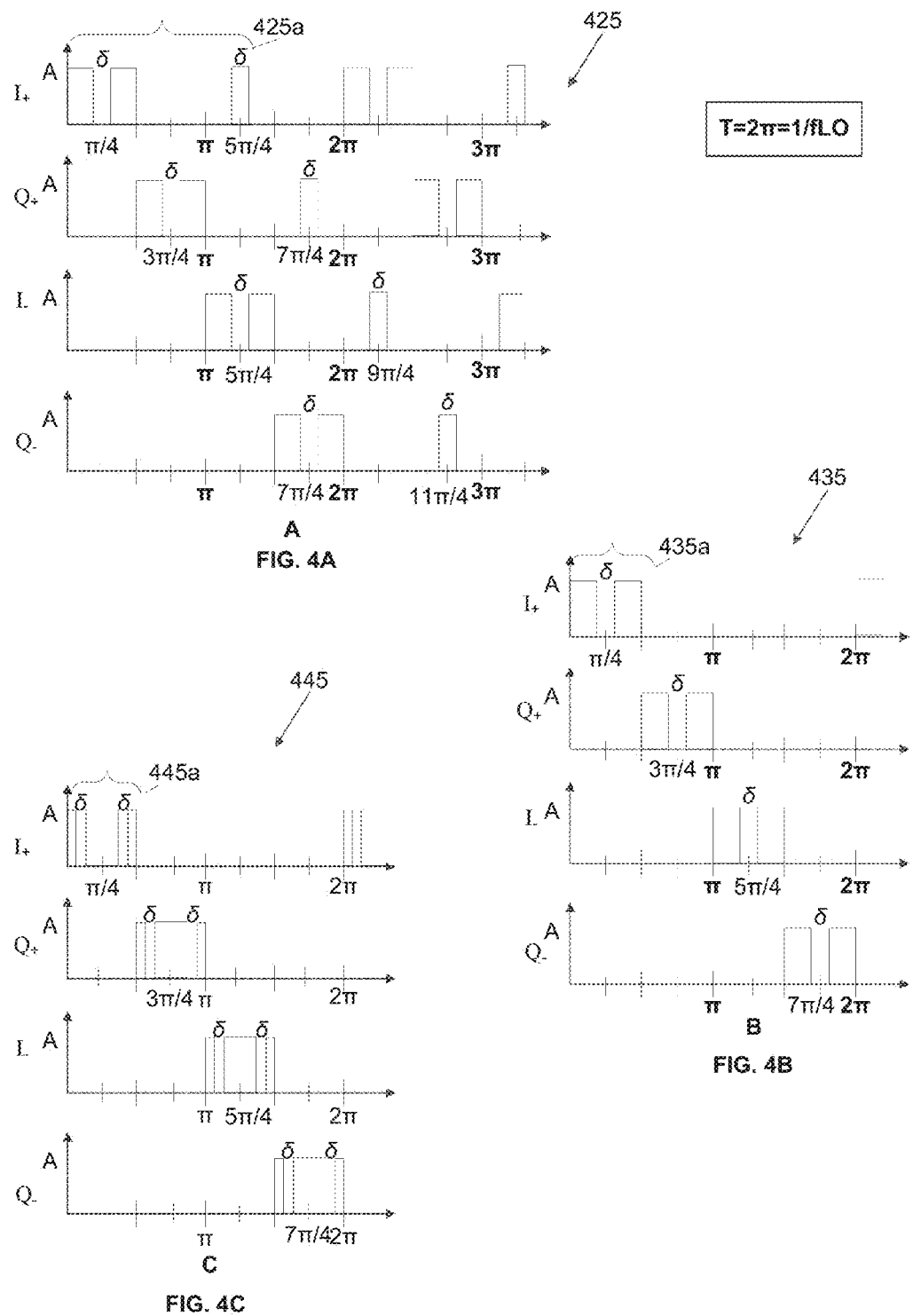
FIGS. 4A-4C illustrate example harmonic suppressing LO signal pulse series, according to one embodiment of the disclosure.

Referring now to FIGS. 4A, 4B, and 4C, three harmonic suppressing pulse patterns are illustrated. While three particular pulse patterns will be described, any number of pulse patterns that include gaps to remove content from the LO signal at a target harmonic may be used. FIG. 4A illustrates a harmonic suppressing LO signal 425, that includes a series of pulses, such as pulse series 425a, for each phase of the mixer. The pulse pattern of LO signal 425 will be called pulse pattern "A". Pulse pattern A inserts a gap with a duration of δ in the middle of a standard 25% duty cycle pulse and also adds a pulse having duration δ at an offset of π from the gap. This pulse pattern A provides the same energy as a standard duty cycle pulse while selectively suppressing harmonics by adjusting the gap duration δ as shown below in table 1.

TABLE 1

| Suppressed Harmonic | δ in % Duty Cycle | Change in Conversion Gain at Fundamental Frequency in dB |
| --- | --- | --- |
| 3rd | 3.83 | −3.6 |
| 5th | 22.28 | −1.7 |
| 7th | 15.93 | −9 |
| 9th | 9.83 | −17 |
| 13th | 8.57 | −4.1 |
| 15th | 7.43 | −9.3 |

The width δ may be calculated by setting the kth Fourier-coefficient of the waveform described by the pulse pattern to zero and solving the nonlinear equation for δ. Pulse pattern A can be used to reject a specific harmonic content in a 25% duty cycle mixer. For example, the suppression of the $3^{rd}$ harmonic in one mixer phase can be realized with the gap duration of δ=3.83% of duty cycle. Table 1 shows the δ value used to suppress specific harmonic content. The drop in the conversion gain compared to the standard 25% duty cycle pulse for each suppressed harmonic is also shown in Table 1.

FIG. 4B illustrates a harmonic suppressing LO signal 435, that includes a series of pulses, such as pulse series 435a, for each phase of the mixer. The pulse pattern of LO signal 435 will be called pulse pattern "B". Pulse pattern B inserts a gap with a duration of δ in the middle of a standard 25% duty cycle pulse but does not include the pulse at the offset of π from the gap that is included in pulse pattern A. The harmonic suppressing characteristics of pulse pattern B as a function of gap duration δ are shown below in Table 2.

TABLE 2

| Suppressed Harmonic | δ in % Duty Cycle | Change in Conversion Gain at Fundamental Frequency in dB |
|---|---|---|
| 3rd | 8.33 | −4.0 |
| 5th | NA | NA |
| 7th | 17.86 | −12.2 |
| 9th | 8.33 | −4.0 |
| 13th | 9.62 | −4.8 |
| 15th | 8.33 | −4.0 |

Table 2 shows that pulse pattern B with a gap duration δ value of 8.33% of duty cycle suppresses the $3^{rd}$, $9^{th}$ and $15^{th}$ harmonic with only a 4 dB decrease in conversion gain. However, pulse pattern B is not as effective at suppressing the $5^{th}$ and $7^{th}$ harmonic.

FIG. 4C illustrates a harmonic suppressing LO signal 445, that includes a series of pulses, such as pulse series 445a, for each phase of the mixer. The pulse pattern of LO signal 445 will be called pulse pattern "C". Pulse pattern C inserts two symmetrical gaps with duration of δ in a 25% duty cycle pulse. The gaps are spaced apart by a center pulse. In one embodiment, the center pulse has a duration of 2δ. Thus, pulse pattern C can be described as including a first pulse and a second pulse having equal duration and a center pulse occurring between the first pulse and the second pulse, wherein a beginning of the center pulse occurs the gap duration after an end of the first pulse, and an end of the center pulse occurs the gap duration before a beginning of the second pulse. The harmonic suppressing characteristics of pulse pattern C as a function of gap duration δ are shown below in Table 3.

TABLE 3

| Suppressed Harmonic | δ in % Duty Cycle | Change in Conversion Gain at Fundamental Frequency in dB |
|---|---|---|
| 5th | 4.54 | −4.0 |
| 7th | 3.25 | −2.8 |

Pulse pattern C is advantageous for suppressing the $5^{th}$ and $7^{th}$ harmonics. In general, pulse pattern A can be used to suppress the $3^{rd}$, $5^{th}$ or $13^{th}$ harmonic. Pulse pattern B can be used to suppress the $3^{rd}$, $9^{th}$, $13^{th}$, $15^{th}$, $21^{st}$, and so on simultaneously using a gap duration of 8.33% of duty cycle. Pulse pattern C can be used to reject $5^{th}$ or $7^{th}$ harmonic content.

Returning now to FIG. 3, one embodiment of the selection circuitry 340 is illustrated that is configured to read look up tables to select a pulse pattern and gap duration for use by the generation circuitry 350 in generating a harmonic suppressing LO signal. The selection circuitry 340 is configured to i) identify a target harmonic that is likely to cause interference and ii) select a pulse pattern and gap duration associated with the target harmonic. The selection circuitry 340 identifies the target harmonic based on the frequencies of other mixers in the transceiver 300, such as the second receive frequency fLO2 and the transmit frequency fTx. In some transceivers more than two receivers may be present and/or more than one transmitter may be present, increasing the number of frequencies considered by the selection circuitry. For the embodiment illustrated in FIG. 2, the selection circuitry 340 identifies the target frequency based on two or more of i) a transmitter frequency, ii) a first receive frequency, or iii) a second receive frequency. The phrase "two or more of A, B, or C" means any combination that includes at least two entities selected from the set that includes A, B, and C, (e.g., i) A and B or ii) A, B, and C, or iii) A and C, and so on).

A first lookup table 343 maps combinations of transmit frequency fTx, first receive frequency fLO1, and second receive frequency fLO2 to a target harmonic that is likely to cause interference. The entries shown in the look up table 343 embody the examples of interference shown in FIGS. 1A-1C. While only four entries are shown in look up table 343, many more entries may be stored, depending on the different combinations of frequencies that will be experienced by the transceiver 300 in operation. As additional frequency scenarios (e.g., carrier aggregation scenarios) are put into use by the transceiver, additional entries may be stored in the look up table 343. It can be seen, for example, in look up table 343 that for first receive frequency fLO1=2137.5 MHz and fLO2=2142.5 MHz, the $3^{rd}$ harmonic of the LO signal to the first receiver should be suppressed.

In general, the target harmonic can be identified by calculating harmonics and spurs caused by certain laws of harmonics based on the different mixer frequencies and determining if any of the harmonics are within a predetermined proximity (in terms of frequency) of interference signals, (e.g., blockers, fTx, Tx harmonics, and so on). If so, a target harmonic is selected for suppression that will eliminate the identified interference. The predetermined proximity may be specified in terms of a percentage of frequency or any other appropriate manner. For identifying a target harmonic of an LO signal for a receiver that is likely to interfere with the transmitter, the following test could be used. If k*fTx for integer k is within the proximity limit of m*fLO1, where m is a positive integer, then select the mth harmonic of fLO1 as the target harmonic. If k*fTx for integer k is within the proximity limit of n*fLO2, where n is a positive integer, then select the nth harmonic of fLO2 as the target harmonic.

For identifying a target harmonic of an LO signal for a receiver that, due to coupling with another receiver, is likely to generate a spur that interferes with the transmitter, the following test could be used. If the spur frequency fsp=m*fLO1+/−v*fLO2 is within the proximity limit of fTx, then select either the mth harmonic of fLO1 or the with harmonic of fLO2 as the target harmonic. The spurs created by various laws of harmonics can be computed and compared to the transmit frequency. The look up table 343 may store the results of these analyses. In addition to interference caused by interactions between transmit and receive frequencies, harmonics of other clock signals associated with nearby circuitry, such as an analog-to-digital converter (ADC) or a digitally controlled oscillator (DCO) may couple with an LO signal to generate a spur. Thus, the lookup table 343 may also map ADC frequencies and DCO frequencies to target harmonics. For the purposes of this description, the receiver LO signals fLO, the transmit frequency FTx, the ADC clock signal, and the DCO clock signal, as well as any other clock signal having harmonics that might cause interference during CA operation may be referred to collectively as "clock signals."

In other embodiments, rather than reading a look up table, the selection circuitry 340 may calculate the various harmonics and spurs based on the frequencies presently in use by circuitry within the transceiver and identify the target harmonic as just described based on results of the calculations. Thus, the selection circuitry 340 can determine harmonics and spurs that are potential target harmonics by accessing a lookup table or by computing the harmonics and spurs of frequencies presently in use, or in any other appropriate way.

A second look up table 345 maps pulse pattern and gap duration combinations to target harmonics. The selection circuitry 340 accesses the second look up table 345 to select a pulse pattern and a gap duration associated with the target harmonic. For simplicity the look up table 345 stores only a portion of the results shown in Tables 1, 2, and 3. Other pulse patterns and gap durations may be stored. It can be seen in FIG. 3 that the pulse pattern B and gap duration δ 8.33 have been selected by the selection circuitry 340. The selected pulse pattern and gap duration are provided to the generation circuitry 350.

The generation circuitry 350 is configured to generate the harmonic suppressing LO signal by generating a signal that includes pulses and gaps as specified by the selection circuitry 340. The generation circuitry 350 includes a digitally controlled oscillator (DCO) (not shown) that generates a timing signal at the desired receive frequency (e.g., fLO1 or fLO2). Additional circuitry (not shown) in the generation circuitry 350 uses the DCO timing signal to generate the selected harmonic suppressing LO signal or the standard LO signal as appropriate.

Figure 5:
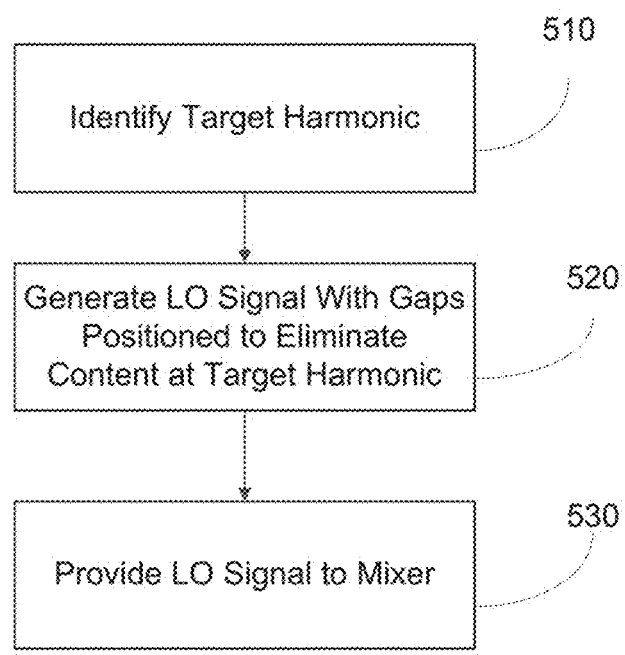
FIG. 5 illustrates a flowchart that outlines a method for generating a harmonic suppressing LO signal pulse series, according to one embodiment of the disclosure.

FIG. 5 depicts a flowchart outlining one embodiment of a method 500 for selectively generating a harmonic suppressing LO signal. The method 500 may be performed by the LO signal circuitry 220, the LO signal circuitry 320, the selection circuitry 340, and/or the generation circuitry 350 acting alone or in combination. At 510, the method includes identifying a target harmonic of a first LO frequency that is likely to cause interference. At 520, an LO signal is generated. The LO signal has the first LO frequency and is characterized by a pulse pattern that includes a series of at least two pulses spaced apart by at least one gap having a gap duration. The at least one gap is positioned such that the LO signal has no content at the target harmonic. At 530, the method includes providing the LO signal to a mixer for converting an information signal encoding data being communicated to a desired frequency.

It can be seen from the foregoing description that the various harmonic suppressing LO signals allow for suppression of selected harmonics. An LO signal having a series of pulses may be generated based on a type of interference being avoided. The techniques described herein have lower power consumption than other LO signals (e.g., LO signals generated by adding three square waves). The selected harmonic(s) is/are suppressed in all four mixer signal phases, rather than all harmonics being present in all four mixer signal phases. When an LO signal is generated that suppresses a selected harmonic, additional harmonics may also be suppressed.

Figure 6:
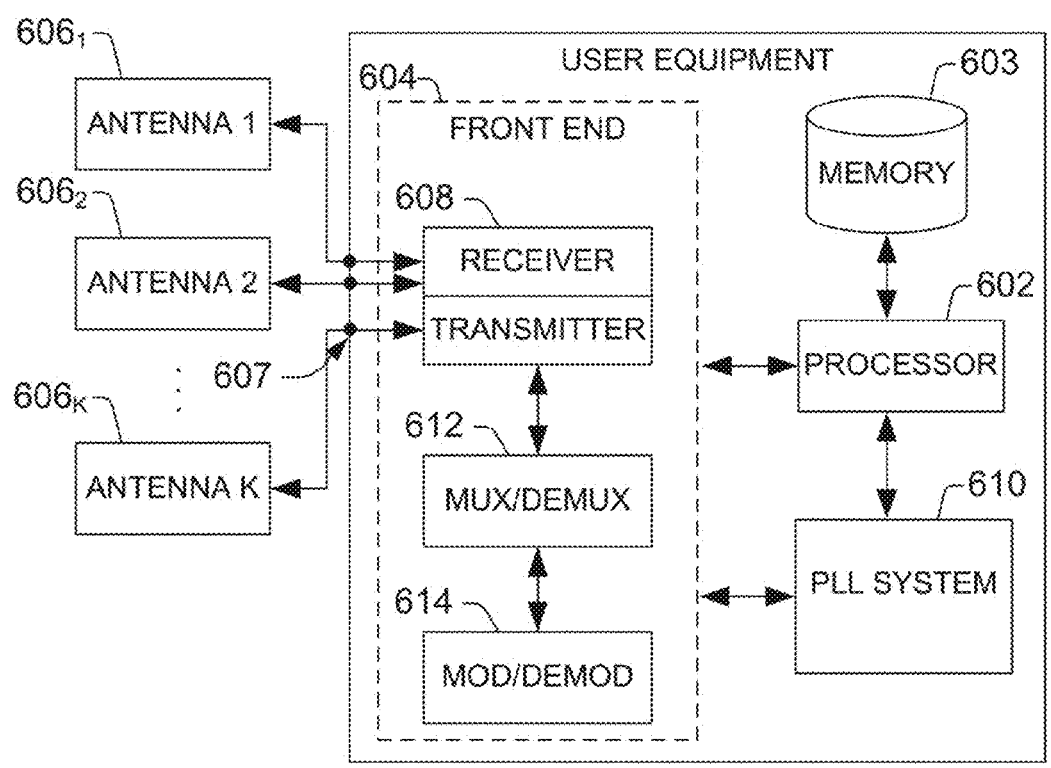
FIG. 6 illustrates an example user equipment device that includes a transceiver front end that utilizes harmonic suppressing local oscillator signals, according to one embodiment of the disclosure.

To provide further context for various aspects of the disclosed subject matter, FIG. 6 illustrates a block diagram of an embodiment of user equipment 600 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 600 can be utilized with one or more aspects of the harmonic suppressing LO signal generation described herein according to various aspects. The user equipment device 600, for example, comprises a digital baseband processor 602 that can be coupled to a data store or memory 603, a front end 604 (e.g., an RF front end, an acoustic front end, or the other like front end) and a plurality of antenna ports 607 for connecting to a plurality of antennas $606_1$ to $606_k$ (k being a positive integer). The antennas $606_1$ to $606_k$ can receive and transmit signals to and from one or more wireless devices such as access points, access terminals, wireless ports, routers and so forth, which can operate within a radio access network or other communication network generated via a network device (not shown).

The user equipment 600 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 604 can include a communication platform, which comprises electronic components and associated circuitry that provide for processing, manipulation or shaping of the received or transmitted signals via one or more receivers or transmitters (e.g. transceivers) 608, a mux/demux component 612, and a mod/demod component 614. The mod/demod component 614 and/or the mux/demux component 612 may be configured to generate harmonic suppressing LO signals as described herein. The front end 604 is coupled to the digital baseband processor 602 and the set of antenna ports 607, in which the set of antennas $606_1$ to $606_k$ can be part of the front end. In one aspect, the user equipment device 600 can comprise a phase locked loop system 610.

The processor 602 can confer functionality, at least in part, to substantially any electronic component within the mobile communication device 600, in accordance with aspects of the disclosure. As an example, the processor 602 can be configured to execute, at least in part, executable instructions that select an LO pulse pattern and/or a gap duration δ as disclosed in FIGS. 2-6. Thus the processor 602 may embody various aspects of the LO signal generation circuitry of FIGS. 2-3 as a multi-mode operation chipset that generates LO signals that suppress selected harmonics to mitigate interference.

The processor 602 is functionally and/or communicatively coupled (e.g., through a memory bus) to memory 603 in order to store or retrieve information necessary to operate and confer functionality, at least in part, to communication platform or front end 604, the phase locked loop system 610 and substantially any other operational aspects of the phase locked loop system 610. The phase locked loop system 610 includes at least one oscillator (e.g., a VCO, DCO or the like) that can be calibrated via core voltage, a coarse tuning value, signal, word or selection process according the various aspects described herein.

The processor 602 can operate to enable the mobile communication device 600 to process data (e.g., symbols, bits, or chips) for multiplexing/demultiplexing with the mux/demux component 612, or modulation/demodulation via the mod/demod component 614, such as implementing direct and inverse fast Fourier transforms, selection of modulation rates, selection of data packet formats, inter-packet times, etc. Memory 603 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. In one embodiment, memory 603 stores one or more lookup tables that map frequency combinations to harmonics or pulse patterns and gap durations to harmonics as shown in FIG. 3.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Examples

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Example 1 is transceiver, including: local oscillator (LO) signal circuitry configured to output an LO signal having an LO frequency. The LO signal circuitry includes: selection circuitry configured to select a pulse pattern and a gap duration based at least on a target harmonic of the LO frequency to be suppressed; and generation circuitry configured to generate an LO signal characterized by the selected pulse pattern and gap duration; and mixer circuitry configured to input the LO signal and an information signal that encodes communication data and output a shifted signal that corresponds to the information signal shifted to a desired frequency.

Example 2 includes the subject matter of example 1, including or omitting optional elements, wherein the pulse pattern includes two pulses that occur during a single period of the LO signal, further wherein the two pulses are spaced apart by a gap having the gap duration.

Example 3 includes the subject matter of example 1, including or omitting optional elements, wherein the LO signal circuitry is configured to generate four LO signal components, wherein each LO signal component is characterized by the selected pulse pattern and gap duration, wherein each LO signal component has a 25% duty cycle.

Example 4 includes the subject matter of examples 1, 2 and 3, including or omitting optional elements, wherein the duty cycles of the four LO signal components are non-overlapping.

Example 5 includes the subject matter of examples 1, 2 and 3, including or omitting optional elements, wherein the selection circuitry is configured to: identify the target harmonic based on at least two clock signals in use by the transceiver; select a pulse pattern and gap duration associated with the target harmonic; and provide the selected pulse pattern and gap duration to the generation circuitry.

Example 6 includes the subject matter of examples 1, 2 and 3, including or omitting optional elements, wherein the selection circuitry is configured to: determine a i) first set of harmonics of a first frequency associated with a transmitter or receiver of the transceiver and ii) a second set of harmonics of a second frequency associated with a different transmitter or receiver of the transceiver; and when a harmonic of the first frequency is within a predetermined proximity to a harmonic of the second frequency, select either the harmonic of the first frequency or the harmonic of the second frequency as the target harmonic.

Example 7 includes the subject matter of examples 1, 2 and 3, including or omitting optional elements, wherein the selection circuitry is configured to: determine i) a set of harmonics of a transmit frequency associated with a transmitter of the transceiver and ii) a set of spur frequencies including combinations of a harmonic of a first receive frequency associated with a first receiver of the transceiver and a harmonic of a second receive frequency associated with a second receiver of the transceiver; and when a harmonic of a fundamental transmit frequency is within a predetermined proximity to a spur frequency including a combination of any receive frequencies, select a harmonic of one of the receive frequencies that is generating the spur frequency as the target harmonic.

Example 8 includes the subject matter of examples 1, 2 and 3, including or omitting optional elements, wherein the pulse pattern includes a pair of pulses having equal duration, further wherein the durations of the pulses combined with the gap duration is equal to 25% of the period of the LO signal.

Example 9 includes the subject matter of example 8, including or omitting optional elements, The transceiver of claim 8, wherein the pulse pattern includes a third pulse occurring half a period after a beginning of the gap.

Example 10 includes the subject matter of examples 1, 2 and 3, including or omitting optional elements, wherein the pulse pattern includes a first pulse and a second pulse having equal duration and a center pulse occurring between the first pulse and the second pulse, wherein a beginning of the center pulse occurs the gap duration after an end of the first pulse, and an end of the center pulse occurs the gap duration before a beginning of the second pulse, further wherein, the durations of the pulses combined with two times the gap duration is equal to 25% of the period of the LO signal.

Example 11 is a method, including: identifying a target harmonic of a first LO frequency that is likely to cause interference; generating an LO signal having the first LO frequency, wherein the LO signal is characterized by a pulse pattern including a series of least two pulses spaced apart by at least one gap having a gap duration, wherein the at least one gap is positioned such that the LO signal has no content at the target harmonic; and providing the LO signal to a mixer for shifting an information signal encoding communication data between a baseband frequency and an RF frequency.

Example 12 includes the subject matter of examples 12, including or omitting optional elements, further including: reading a lookup table that maps respective pulse pattern and gap duration pairs to respective harmonics that are suppressed by an LO signal having the pulse pattern and gap duration; selecting a pulse pattern and gap duration pair mapped to the target harmonic; and generating an LO signal having the first frequency that is characterized by the selected pulse pattern and gap duration.

Example 13 includes the subject matter of example 11, including or omitting optional elements, wherein identifying the target harmonic includes: computing harmonics of two or more of a transmitter frequency, a first receive frequency, or a second receive frequency; and identifying a harmonic that is within a proximity limit of another harmonic as the target harmonic.

Example 14 includes the subject matter of example 11, including or omitting optional elements, wherein identifying the target harmonic includes: computing i) a set of harmonics of a transmit frequency associated with a transmitter of the transceiver and ii) a set of spur frequencies including combinations of a harmonic of a first receive frequency associated with a first receiver of the transceiver and a harmonic of a second receive frequency associated with a second receiver of the transceiver; and when a harmonic of a fundamental transmit frequency is within a predetermined proximity to a spur frequency including a combination of any receive frequencies, selecting a harmonic of one of the receive frequencies that is generating the spur frequency as the target harmonic.

Example 15 includes the subject matter of examples 11, 12, 13 and 14, including or omitting optional elements, wherein the pulse pattern includes a pair of pulses having equal duration, further wherein the durations of the pulses combined with the gap duration is equal to 25% of the period of the LO frequency.

Example 16 includes the subject matter of example 15, including or omitting optional elements, wherein the pulse pattern includes a third pulse occurring half a period after a beginning of the second pulse, further wherein the durations of the pair of pulses and the third pulse combined is equal to 25% of the period of the LO frequency.

Example 17 includes the subject matter of examples 11, 12, 13 and 14, including or omitting optional elements, wherein the pulse pattern includes a first pulse and a second pulse having equal duration and a center pulse occurring between the first pulse and the second pulse, wherein a beginning of the center pulse occurs the gap duration after an end of the first pulse, and an end of the center pulse occurs the gap duration before a beginning of the second pulse, further wherein, the durations of the pulses combined with two times the gap duration is equal to 25% of the period of the LO frequency.

Example 18 includes the subject matter of examples 11, 12, 13 and 14, including or omitting optional elements, further including: determining that the first LO frequency has changed to a second LO frequency; determining a second target harmonic of the second LO frequency that is likely to cause interference; generating a second LO signal having the second LO frequency, wherein the second LO signal includes a series of least two pulses spaced apart by at least one gap, wherein the at least one gap is positioned such that the second LO signal has no content at the second target harmonic, further wherein the second LO signal is different from the first LO signal in pulse pattern or gap duration; and providing the second LO signal to the mixer.

Example 19 is local oscillator (LO) signal circuitry for use in a transceiver, the LO signal circuitry configured to output an LO signal having an LO frequency, including generation circuitry configured to: generate the LO signal, wherein the LO signal is characterized by a pulse pattern and a gap duration signal, wherein the LO signal includes two pulses spaced apart by a gap having the gap duration; and provide the LO signal to mixer circuitry configured to shift an information signal that encodes communication data to a desired frequency. The LO signal circuitry also includes selection circuitry configured to: identify a target harmonic of the LO frequency that is likely to cause interference; select a pulse pattern and a gap duration based at least on the target harmonic; and control the generation circuitry based at least on the pulse pattern and gap duration to generate the LO signal.

Example 20 includes the subject matter of example 19, including or omitting optional elements, wherein the gap is positioned such that the LO signal has no content at the target harmonic.

Example 21 includes the subject matter of examples 19 and 20, including or omitting optional elements, further including: memory configured to store a first lookup table that maps respective pulse pattern and gap duration pairs to respective harmonics that are suppressed by an LO signal having the pulse pattern and gap duration; memory configured to store a second lookup table that maps respective combinations of clock signal frequencies to respective target harmonics; and wherein the selection circuitry is configured to read the first lookup table and the second lookup table to select the target harmonic.

Example 22 includes the subject matter of example 21, including or omitting optional elements, wherein the second lookup table maps respective combinations of two or more of: i) a transmitter frequency, ii) two or more receiver LO frequencies, iii) an analog to digital converter clock frequency, or iv) a digitally controlled oscillator frequency, to respective target harmonics.

Example 23 includes the subject matter of examples 19 and 20, including or omitting optional elements, wherein the pulse pattern includes two pulses that occur during a single period of the LO.

Example 24 is an apparatus, including: means for identifying a target harmonic of a first LO frequency that is likely to cause interference; means for generating an LO signal having the first LO frequency, wherein the LO signal is characterized by a pulse pattern including a series of least two pulses spaced apart by at least one gap having a gap duration, wherein the at least one gap is positioned such that the LO signal has no content at the target harmonic; and means for providing the LO signal to a mixer for shifting an information signal encoding communication data between a baseband frequency and an RF frequency.

Example 25 includes the subject matter of example 24, including or omitting optional elements, further including: means for reading a lookup table that maps respective pulse pattern and gap duration pairs to respective harmonics that are suppressed by an LO signal having the pulse pattern and gap duration; means for selecting a pulse pattern and gap duration pair mapped to the target harmonic; and means for generating an LO signal having the first frequency that is characterized by the selected pulse pattern and gap duration.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. A transceiver, comprising:
  local oscillator (LO) signal circuitry configured to output an LO signal having an LO frequency, wherein each period of the LO signal is characterized by a duty cycle portion during which the LO signal includes at least two pulses configured to bias a switch, wherein the duty cycle has a duration that is less than an LO signal period, comprising:
    selection circuitry configured to select a pulse pattern and a gap duration based at least on a target harmonic of the LO frequency to be suppressed, wherein the gap is characterized as a time interval during the duty cycle in which the LO signal has no content; and
    generation circuitry configured to generate the LO signal characterized by each duty cycle portion comprising the selected pulse pattern and gap duration; and
  mixer circuitry configured to input the LO signal and an information signal that encodes communication data and output a shifted signal that corresponds to the information signal shifted to a desired frequency.

2. The transceiver of claim 1, wherein the pulse pattern comprises two pulses that occur during a single period of the LO signal, further wherein the two pulses are spaced apart by a gap having the gap duration.

3. The transceiver of claim 1, wherein the LO signal circuitry is configured to generate four LO signal components, wherein the duty cycle portion of each LO signal component is characterized by the selected pulse pattern and gap duration, wherein each LO signal component has a duty cycle portion having a duration of 25% of the LO signal period.

4. The transceiver of claim 3 wherein the duty cycles of the four LO signal components are non-overlapping.

5. The transceiver of claim 1, wherein the selection circuitry is configured to:
  identify the target harmonic based on at least two clock signals in use by the transceiver;
  select a pulse pattern and gap duration associated with the target harmonic; and
  provide the selected pulse pattern and gap duration to the generation circuitry.

6. The transceiver of claim 1 wherein the selection circuitry is configured to:
  determine i) a first set of harmonics of a first frequency associated with a transmitter or receiver of the transceiver and ii) a second set of harmonics of a second frequency associated with a different transmitter or receiver of the transceiver; and
  when a harmonic of the first frequency is within a predetermined proximity to a harmonic of the second frequency, select either the harmonic of the first frequency or the harmonic of the second frequency as the target harmonic.

7. The transceiver of claim 1 wherein the selection circuitry is configured to:
  determine i) a set of harmonics of a transmit frequency associated with a transmitter of the transceiver and ii) a set of spur frequencies comprising combinations of a harmonic of a first receive frequency associated with a first receiver of the transceiver and a harmonic of a second receive frequency associated with a second receiver of the transceiver; and
  when a harmonic of a fundamental transmit frequency is within a predetermined proximity to a spur frequency comprising a combination of any receive frequencies, select a harmonic of one of the receive frequencies that is generating the spur frequency as the target harmonic.

8. The transceiver of claim 1, wherein the pulse pattern comprises a pair of pulses having equal duration, further wherein the durations of the pulses combined with the gap duration is equal to 25% of the period of the LO signal.

9. The transceiver of claim 8, wherein the pulse pattern comprises a third pulse occurring half a period after a beginning of the gap.

10. The transceiver of claim 1, wherein the pulse pattern comprises a first pulse and a second pulse having equal duration and a center pulse occurring between the first pulse and the second pulse, wherein a beginning of the center pulse occurs the gap duration after an end of the first pulse, and an end of the center pulse occurs the gap duration before a beginning of the second pulse, further wherein, the durations of the pulses combined with two times the gap duration is equal to 25% of the period of the LO signal.

11. A method, comprising:
  identifying a target harmonic of a first LO frequency that is likely to cause interference;
  generating an LO signal having the first LO frequency, wherein each period of the LO signal is characterized by a duty cycle portion during which the LO signal includes at least two pulses configured to bias a switch, wherein the duty cycle has a duration that is less than the LO signal period, wherein each duty cycle portion is further characterized by a pulse pattern comprising the at least two pulses spaced apart by at least one gap having a gap duration, wherein the gap is characterized as a time interval during the duty cycle in which the LO signal has no content, and further wherein the at least one gap is positioned such that the LO signal has no content at the target harmonic; and providing the LO signal to a mixer for shifting an information signal encoding communication data between a baseband frequency and an RF frequency.

12. The method of claim 11, further comprising:
determining that the first LO frequency has changed to a second LO frequency;
determining a second target harmonic of the second LO frequency that is likely to cause interference;
generating a second LO signal having the second LO frequency, wherein the second LO signal comprises a second duty cycle portion comprising a series of least two pulses spaced apart by at least one gap, wherein the at least one gap is positioned such that the second LO signal has no content at the second target harmonic, further wherein the second LO signal is different from the first LO signal in pulse pattern or gap duration; and
providing the second LO signal to the mixer.

13. The method of claim 11, further comprising:
reading a lookup table that maps respective pulse pattern and gap duration pairs to respective harmonics that are suppressed by the LO signal having the pulse pattern and gap duration;
selecting a pulse pattern and gap duration pair mapped to the target harmonic;
generating the LO signal having the first LO frequency that is characterized by the selected pulse pattern and gap duration.

14. The method of claim 11, wherein identifying the target harmonic comprises:
computing harmonics of two or more of a transmitter frequency, a first receive frequency, or a second receive frequency; and
identifying a harmonic that is within a proximity limit of another harmonic as the target harmonic.

15. The method of claim 11, wherein identifying the target harmonic comprises:
computing i) a set of harmonics of a transmit frequency associated with a transmitter of the transceiver and ii) a set of spur frequencies comprising combinations of a harmonic of a first receive frequency associated with a first receiver of the transceiver and a harmonic of a second receive frequency associated with a second receiver of the transceiver; and
when a harmonic of a fundamental transmit frequency is within a predetermined proximity to a spur frequency comprising a combination of any receive frequencies, selecting a harmonic of one of the receive frequencies that is generating the spur frequency as the target harmonic.

16. The method of claim 11, wherein the pulse pattern comprises a pair of pulses having equal duration, further wherein the durations of the pulses combined with the gap duration is equal to 25% of the period of the LO signal.

17. The method of claim 11, wherein the pulse pattern comprises a third pulse occurring half a period after a beginning of the second pulse, further wherein the durations of the pair of pulses and the third pulse combined is equal to 25% of the period of the LO signal.

18. The method of claim 11, wherein the pulse pattern comprises a first pulse and a second pulse having equal duration and a center pulse occurring between the first pulse and the second pulse, wherein a beginning of the center pulse occurs the gap duration after an end of the first pulse, and an end of the center pulse occurs the gap duration before a beginning of the second pulse, further wherein, the durations of the pulses combined with two times the gap duration is equal to 25% of the period of the LO signal.

19. Local oscillator (LO) signal circuitry for use in a transceiver, the LO signal circuitry configured to output an LO signal having an LO frequency, comprising:
generation circuitry configured to:
generate the LO signal, wherein each period of the LO signal is characterized by duty cycle portion during which the LO signal includes at least two pulses configured to bias a switch, wherein the duty cycle is characterized by a pulse pattern and a gap duration, such that each duty cycle portion of the LO signal comprises the at least two pulses spaced apart by a gap having the gap duration, wherein the gap is characterized as a time interval during the duty cycle in which the LO signal has no content; and
provide the LO signal to mixer circuitry configured to shift an information signal that encodes communication data to a desired frequency; and
selection circuitry configured to:
identify a target harmonic of the LO frequency that is likely to cause interference;
select a pulse pattern and a gap duration based at least on the target harmonic; and
control the generation circuitry based at least on the pulse pattern and gap duration to generate the LO signal.

20. The LO signal circuitry of claim 19, wherein the gap is positioned such that the LO signal has no content at the target harmonic.

21. The LO signal circuitry of claim 19, further comprising:
memory configured to store a first lookup table that maps respective pulse pattern and gap duration pairs to respective harmonics that are suppressed by the LO signal having the pulse pattern and gap duration;
memory configured to store a second lookup table that maps respective combinations of clock signal frequencies to respective target harmonics; and
wherein the selection circuitry is configured to read the first lookup table and the second lookup table to select the target harmonic.

22. The LO signal circuitry of claim 19, wherein the second lookup table maps respective combinations of two or more of: i) a transmitter frequency, ii) two or more receiver LO frequencies, iii) an analog to digital converter clock frequency, or iv) a digitally controlled oscillator frequency, to respective target harmonics.

23. The LO signal circuitry of claim 19, wherein the pulse pattern includes two pulses that occur during a single period of the LO signal.

* * * * *